(12) United States Patent
Wang et al.

(10) Patent No.: US 11,888,285 B2
(45) Date of Patent: Jan. 30, 2024

(54) LOW NUMERICAL APERTURE FIBER OUTPUT DIODE LASER MODULE

(71) Applicant: TURNING POINT LASERS CORPORATION, Hsinchu (TW)

(72) Inventors: Chi-Luen Wang, Hsinchu (TW);
Hung-Sheng Lee, Taipei (TW);
Tai-Ming Chang, New Taipei (TW);
Chun-Hui Yu, Taoyuan (TW);
Yu-Ching Yeh, Chiayi County (TW);
Sheng-Ping Lai, Taoyuan (TW);
Shih-Wei Lin, Taoyuan (TW);
Yuan-He Teng, Hsinchu County (TW);
Li-Chang Tsou, Hsinchu (TW);
Szutsun Simon Ou, Taipei (TW)

(73) Assignee: Turning Point Lasers Corporation, Hsinchu (TW)

( * ) Notice: Subject to any disclaimer, the term of this patent is extended or adjusted under 35 U.S.C. 154(b) by 240 days.

(21) Appl. No.: 17/443,559

(22) Filed: Jul. 27, 2021

(65) Prior Publication Data
US 2023/0037106 A1  Feb. 2, 2023

(51) Int. Cl.
| H01S 5/02251 | (2021.01) |
| H01S 5/028 | (2006.01) |
| H01S 5/02253 | (2021.01) |
| H01S 5/00 | (2006.01) |

(52) U.S. Cl.
CPC ........ *H01S 5/02251* (2021.01); *H01S 5/0286* (2013.01); *H01S 5/02253* (2021.01); *H01S 5/0071* (2013.01)

(58) Field of Classification Search
USPC .............................................. 372/6
See application file for complete search history.

(56) References Cited

U.S. PATENT DOCUMENTS

| 2012/0081893 A1* | 4/2012 | Faybishenko | G02B 6/4296 362/294 |
| 2017/0271837 A1* | 9/2017 | Hemenway | H01S 5/141 |
| 2018/0309264 A1* | 10/2018 | Kanskar | H01S 5/02423 |
| 2019/0273365 A1* | 9/2019 | Zediker | H01S 5/4062 |

* cited by examiner

*Primary Examiner* — Tuan N Nguyen
(74) *Attorney, Agent, or Firm* — Rosenberg, Klein & Lee (57) ABSTRACT

A low numerical aperture fiber output diode laser module, which having several independent diode lasers, and collimated and converged the light beam, for the coupling the light to the core optical fiber with a core diameter of 105 um and a numerical aperture of 0.12. Compared with general products with a numerical aperture of 0.22, the light output angle is reduced to 55%, and use a general blue laser diode for verification. Use an optical software for facilitating the design and optimization of the parameters of the optical lens module.

9 Claims, 10 Drawing Sheets

FIG.5A

LOW NUMERICAL APERTURE FIBER OUTPUT DIODE LASER MODULE

BACKGROUND OF THE INVENTION

1. Field of the Invention

The invention relates to a low numerical aperture fiber output diode laser module, especially to one having optical lens module that collimating and converging the light beams for making the light coupled with the core optical fiber to the low numerical aperture.

2. Description of the Related Art

High-brightness lasers are important components in material processing, medical, military, and 3D film and television applications. Semiconductor lasers have become the first choice for manufacturing high-brightness lasers today and in the future due to their mass production, low cost, small size, and high electro-optical conversion efficiency. Semiconductor lasers use optical fibers to output light beams to obtain higher brightness, which has been used for a long time. However, the higher the output power of the semiconductor laser, the lower the quality of the output beam. If it is used as the output end with the existing general core optical fiber with diameter of 105 um, the Beam Parameter Product (BPP) will be greater than 10 mm*mrad, which makes it difficult to achieve high brightness. Therefore, the application of semiconductor lasers cannot be extended to larger uses. Therefore, in view of the above-mentioned problems, the subject of the present invention is to create a high-brightness diode laser module with a low numerical aperture fiber output.

SUMMARY OF THE INVENTION

It is a primary objective of the present invention to provide a low numerical aperture fiber output diode laser module, which uses the low numerical aperture output fiber to improve the efficiency of making the beam divergence smaller.

Another objective of the present invention is to provide a low numerical aperture fiber output diode laser module with high hydroxyl value, making the optic fiber has a better penetration rate for lasers with a wavelength of <460 nm.

Another objective of the present invention is to provide a low numerical aperture fiber output diode laser module which end face of the optic fiber adopts laser beam cutting method, different from ordinary grinding and polishing, this method has the advantages of fast cutting and suitable for mass production.

Another objective of the present invention is to provide a low numerical aperture fiber output diode laser module which laser chip is packaged in an airtight environment to enhance the long-term durability of the laser.

Another objective of the present invention is to provide a low numerical aperture fiber output diode laser module, wherein the resonant cavity of the laser chip is coated with a reflective film with a reflectivity ≥20% for withstanding the higher external reflected light.

In order to achieve the above objectives, the present includes a case; multiple laser diodes, which arranged inside the case for emitting light beams; an optical lens module, which arranged inside the case for collimating the light beams, and then converging into a convergent light beam in a space of the module; and an optic fiber, having a core optical fiber, the output of the optic fiber is setting with a low numerical aperture, and combining the optic fiber at the lateral side of the case, so the convergent light beam can be coupled with the core optical fiber to the low numerical aperture.

Also, wherein the diameter of the core optical fiber is 105 um, and the low numerical aperture is 0.12.

Also, wherein the optic fiber adopts high hydroxyl value.

Also, the end face of the optic fiber adopts laser beam cutting method.

Also, wherein the optic fiber output end adopts a transparent mirror, and the transparent mirror adopts an airtight solder.

Also, the laser diode includes a laser chip, the laser chip has a resonant cavity, the end face of the resonant cavity forms a specular surface and can be electroplated with a reflective film, the reflectance of the reflective film is ≥20%.

Also, wherein at least having more than eight laser diodes.

Also, wherein the wavelength of the laser diode is 450 nm.

Also, wherein the optical lens module includes multiple fast axis collimating lenses, multiple slow axis collimating lenses and multiple reflecting mirrors, first collimating the light beams by each of the fast axis collimating lenses and each of the slow axis collimating lenses, and then the light beams go through each reflecting mirror for converging into a convergent light beam in a space of the module, and the convergent light beam can be coupled with the core optical fiber via a focusing lens.

Also, the case includes a base and a cover, the base is provided with a concave part, the concave part has a mesa, the mesa can hold each of the laser diodes, so that the laser diodes can be arranged parallelly to each other; each of the fast-axis collimating lenses is arranged on the mesa, and is close to the front of each of the laser diodes; each of the slow-axis collimating lenses and each of the reflecting lenses are arranged on the concave part, and each of the slow-axis collimating lenses is arranged in front of each of the fast-axis collimating lenses, each of the reflecting lenses is arranged in front of each of the slow-axis collimating lenses, then the focusing lens is arranged on the lateral side of each of the reflecting lenses and combined on the lateral side of the concave part, and corresponds to the position of the focusing lens that corresponds to the position of the core optical fiber.

With the feature disclosed above, the present invention has the following improved effects those who need to be further clarified:

1. Laser products with smaller angles and better durability can expand the application of semiconductor lasers to larger applications, such as laser welding and metal 3D printing.
2. In consideration of brightness, the output fiber with high hydroxyl value and aperture NA0.12 is adopted. Under the condition of the same core diameter of 105 um, the beam parameter product (BPP) of its beam quality is only 55% of the general NA0.22 optical fiber, and the optical fiber has a better penetration rate for lasers with a wavelength of <460 nm.
3. The end face of the optic fiber adopts laser beam cutting method, different from ordinary grinding and polishing, this method has the advantages of fast cutting and suitable for mass production.
4. The laser chip is packaged in an airtight environment to enhance the long-term durability of the laser. In practice, in addition to sealing the cover by welding, the optical fiber output end adopts a transparent mirror with airtight solder, so that the laser can be operated in an airtight environment and avoid environmental air pollution to the mirror surface of the resonant cavity.

5. The resonant cavity of the laser chip is coated with a reflective film with a higher reflectivity for withstanding the higher external reflected light. Generally, high-power laser diodes focus on the light output efficiency, and the coating reflectivity is usually set below 10%, and can get the light output efficiency with the electro-optical conversion efficiency greater than 50%, but the disadvantage is that it is more sensitive to the reflected light, especially for direct semiconductor lasers processing purposes. In practice, the reflectivity of the coating is increased to more than 20%, which can withstand higher reflected light, especially for laser processing purposes.

DETAILED DESCRIPTION OF THE PREFERRED EMBODIMENT

First, referring to FIG. 1-5B, the present invention is a low numerical aperture fiber output diode laser module including: a case 10, in this embodiment, the case 10 includes a base 11 and a cover 12, the base 11 is provided with a concave part 111, the concave part has a mesa 112, the mesa 112 can hold each of the laser diodes 20, so that the laser diodes 20 can be arranged parallelly to each other, but the present invention is not limit to this application. Moreover, the shape of the case 10 is not limited to the drawings, and the case 10 has a cathode 13 and an anode 14, so the power can be supplied to each laser diodes 20 through the cathode 13 and the anode 14, but the present invention is not limit to this application.

Figure 1:
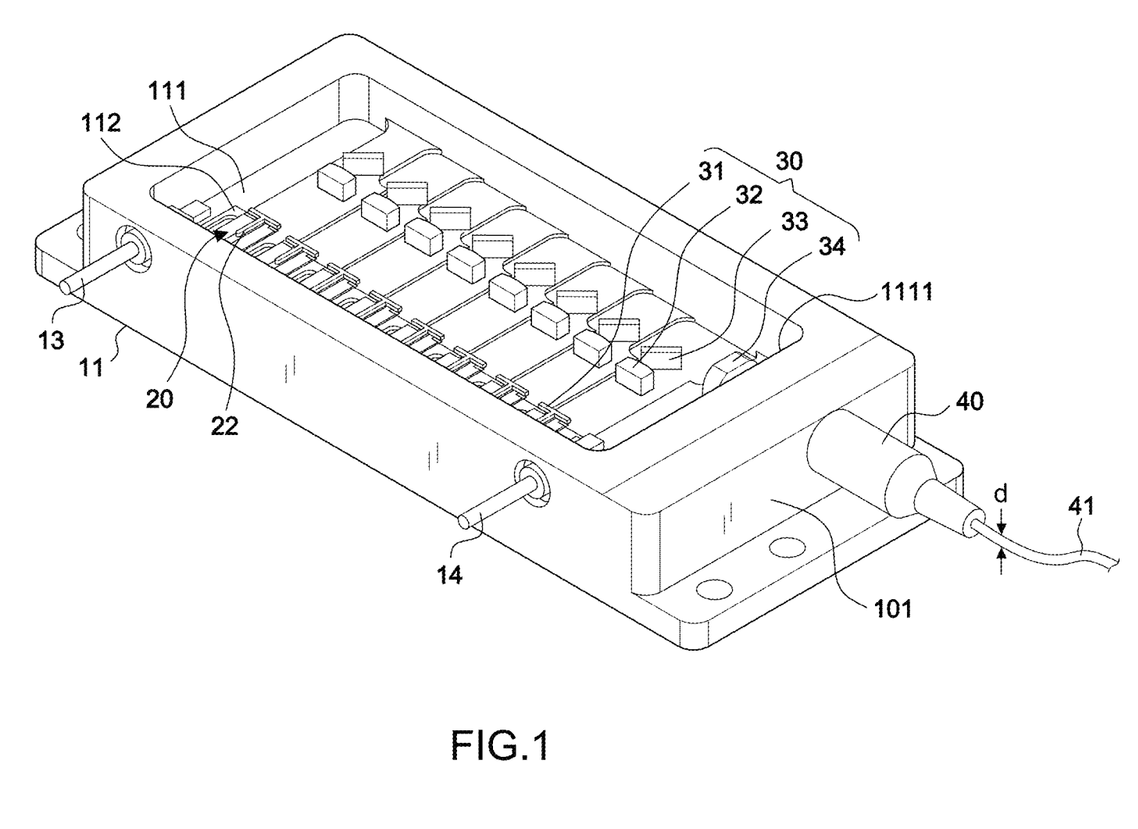
FIG. 1 is perspective view of the present invention before covering with case cover.
Figure 2A:
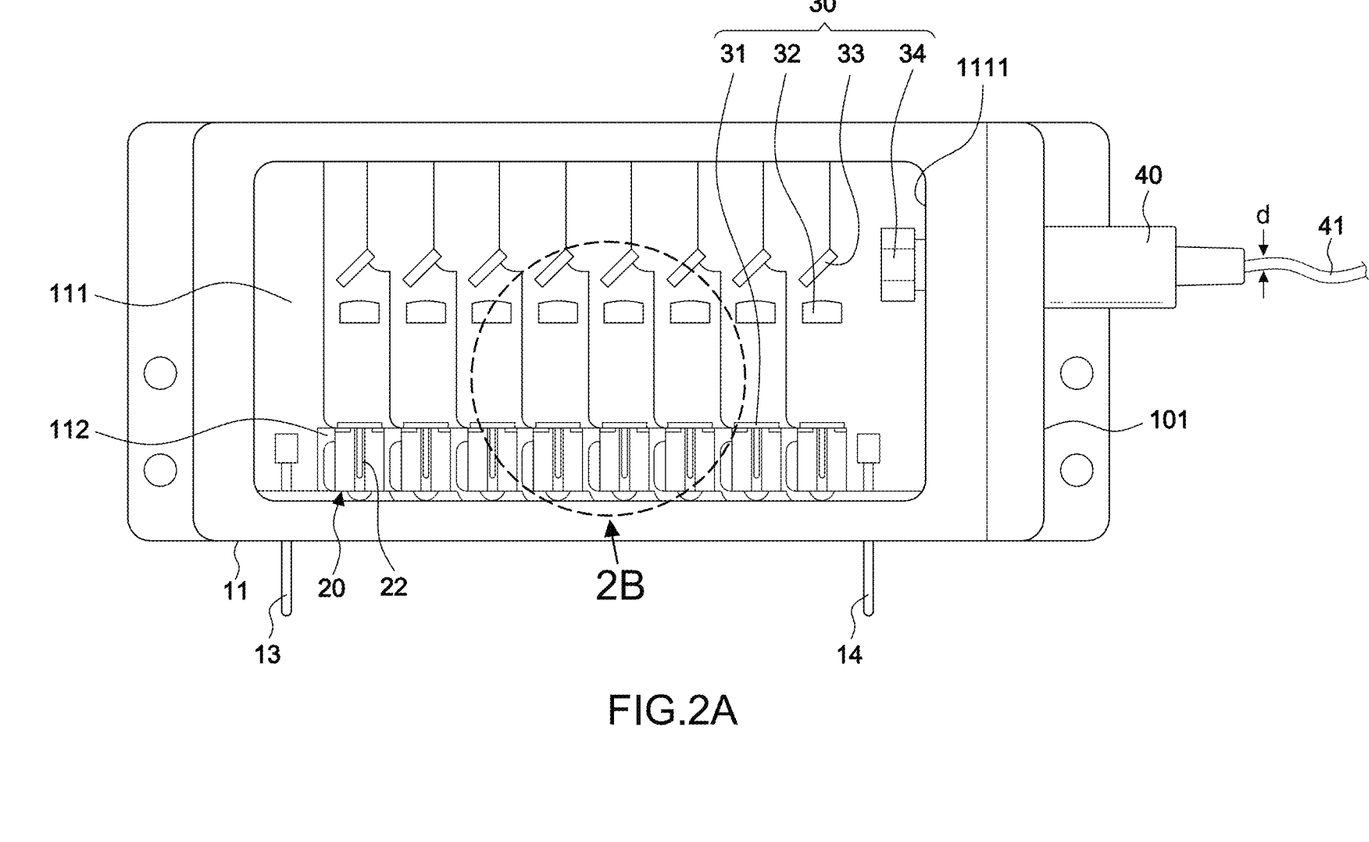
FIG. 2A is front view of the present invention before covering with case cover.
Figure 2B:
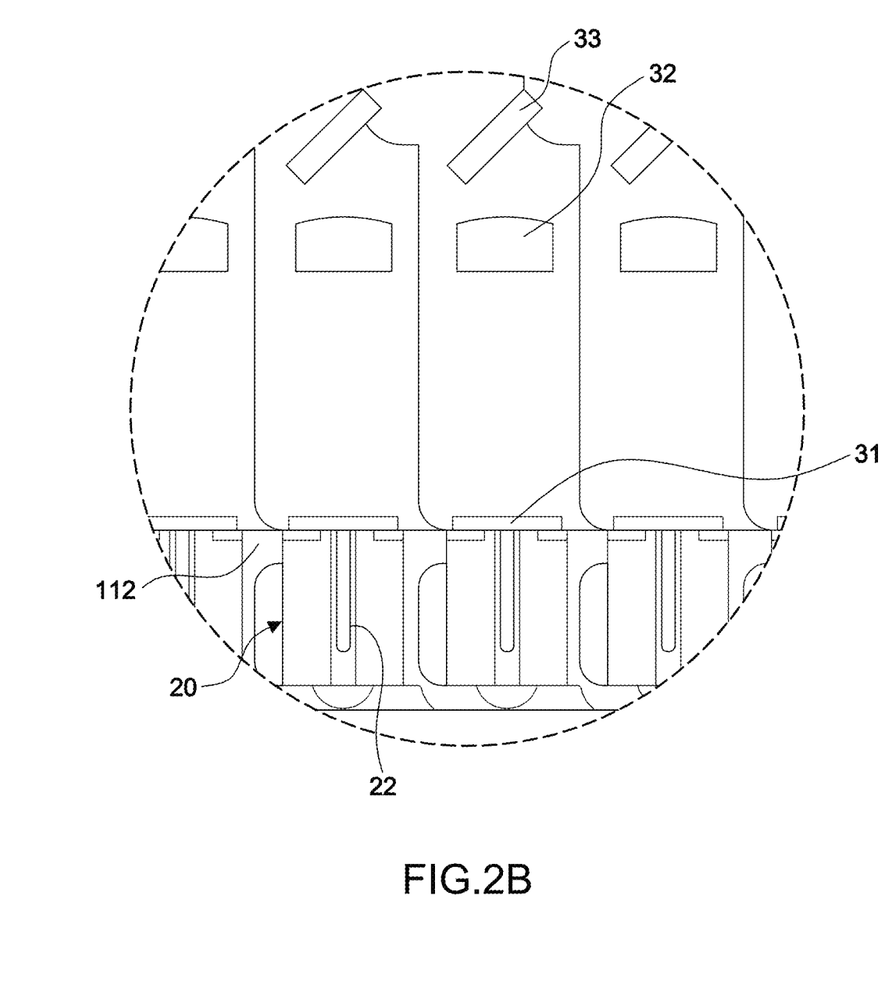
FIG. 2B is a zoom-in of the 2B in the FIG. 2A.

Multiple laser diodes 20 are arranged in the case 10 and excite multiple light beams 21. In this embodiment, the laser diode 20 can be form by a blue laser diode, a red laser, a green laser diode or a UV laser diode, and high-brightness requirements can also be achieved by this method; the laser diode 20 has at least 8 or more laser diode; The wavelength of the laser diode 20 is 400 nm~670 nm, also from UV to red light, but the present invention is not limit to this application.

An optical lens module 30, which arranged inside the case 10 for collimating the light beams 21, and then converging into a convergent light beam L in a space S of the module; in this embodiment, the optical lens module 30 includes multiple fast axis collimating lenses 31, multiple slow axis collimating lenses 32, multiple reflecting mirrors 33 and a focusing mirror 34; each of the fast axis collimating lenses 31 is arranged on the mesa 112 and near to the front of the laser diode 20; each of the slow-axis collimating lenses 32 and each of the reflecting lenses 33 are arranged on the concave part 111, and each of the slow axis collimating lenses 32 is arranged in front of the fast axis collimating lenses 31, and each of the reflecting mirrors 33 is arranged in front of the slow axis collimating lenses 32, for collimating the light beams by each of the fast axis collimating lenses 31 and each of the slow axis collimating lenses 32, and then the light beams go through each reflecting mirror 33 for converging into a convergent light beam L in a space S of the module, but the present invention is not limit to this application.

Figure 2C:
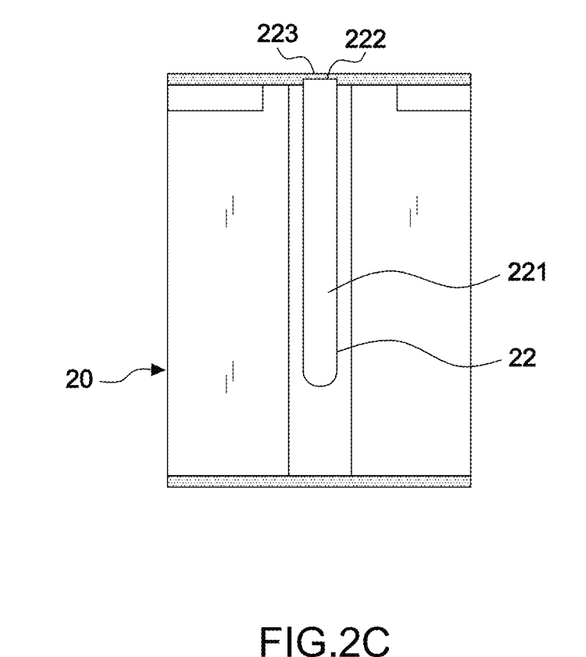
FIG. 2C is a schematic diagram illustrating the laser chip of the present invention.

Also, in this embodiment, as FIG. 2C showing, the laser diode 20 includes a laser chip 22, the laser chip has a resonant cavity 221, the end face of the resonant cavity 221 forms a specular surface 222 and can be electroplated with a reflective film 223, and the reflectance of the reflective film 223 is ≥20%, but the present invention is not limit to this application.

An optic fiber 40 has core optical fiber 41, the output of the optic fiber 40 is setting with a low numerical aperture 42, and combining the optic fiber 40 at the lateral side 101 of the case 10, so the convergent light beam L can be coupled with the core optical fiber 41 to the low numerical aperture 42; in this embodiment, the focusing lens 34 is arranged on the lateral side of each of the reflecting lenses 33 and combined on the lateral side 1111 of the concave part 111, and corresponds to the position of the focusing lens 34 that corresponds to the position of the core optical fiber 41, for making the convergent light beam L couple to the core optical fiber 41, through the focusing lens 34, but the present invention is not limit to this application.

Figure 3A:
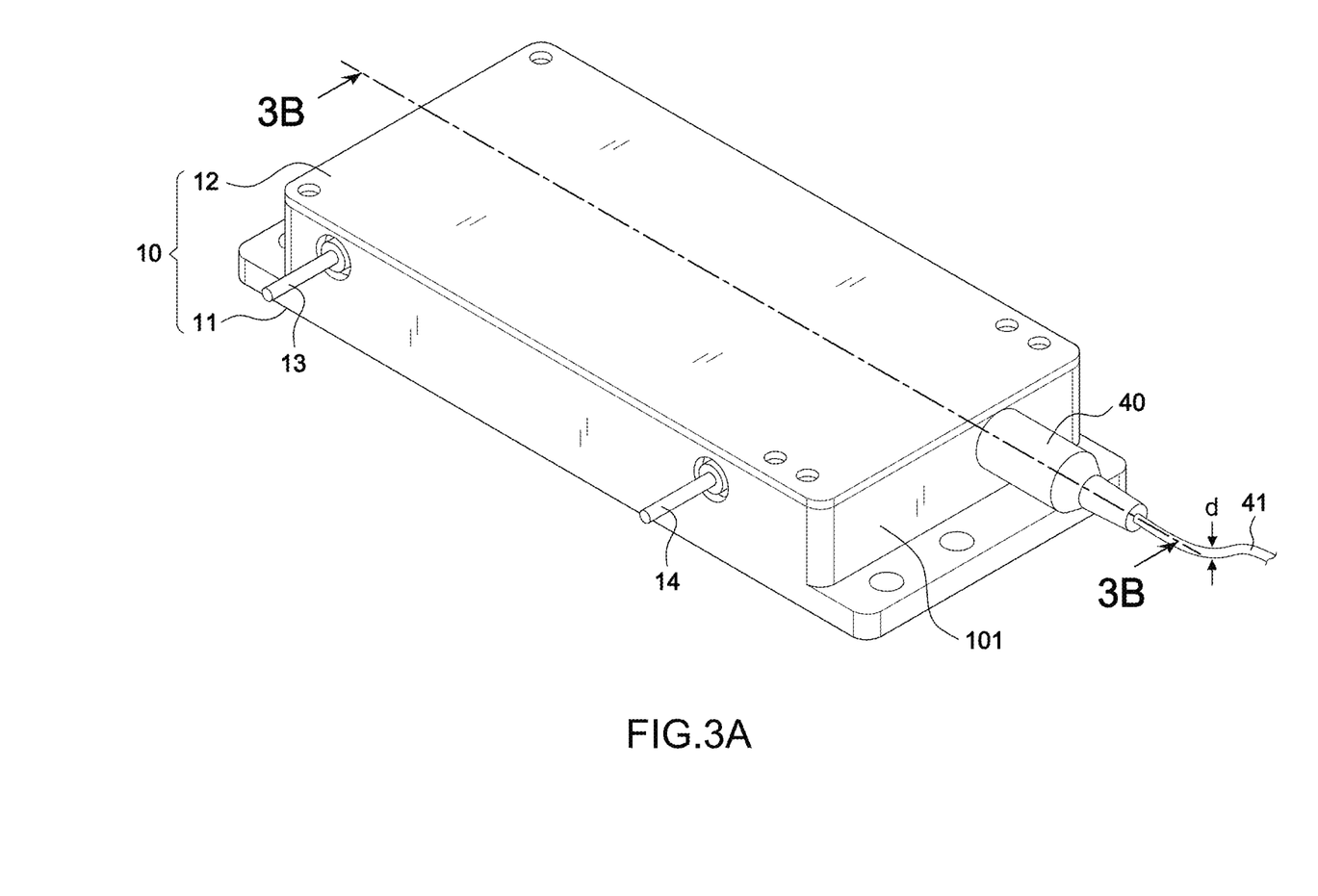
FIG. 3A is perspective view of the present invention after covering with case cover.
Figure 3B:
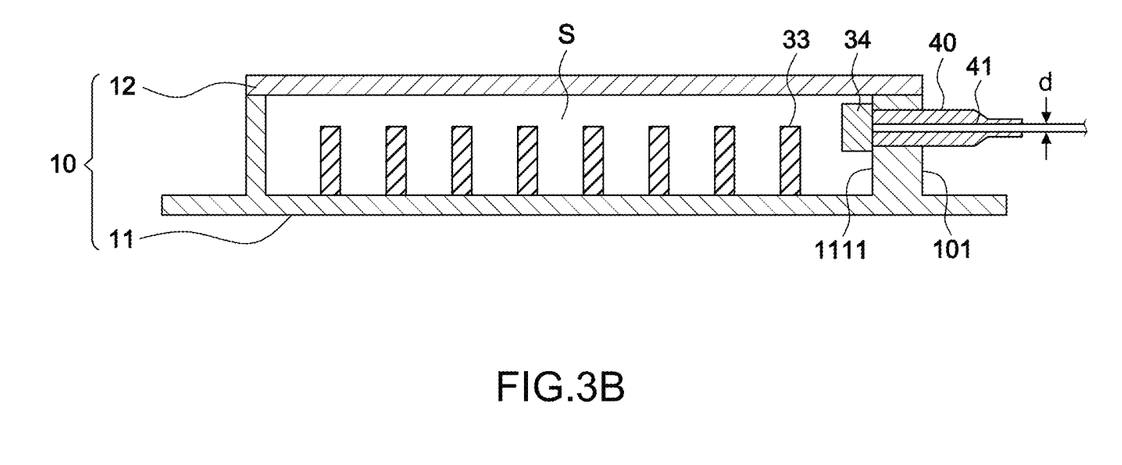
FIG. 3B is a sectional view of the along line 3B-3B in FIG. 3A.
Figure 3C:
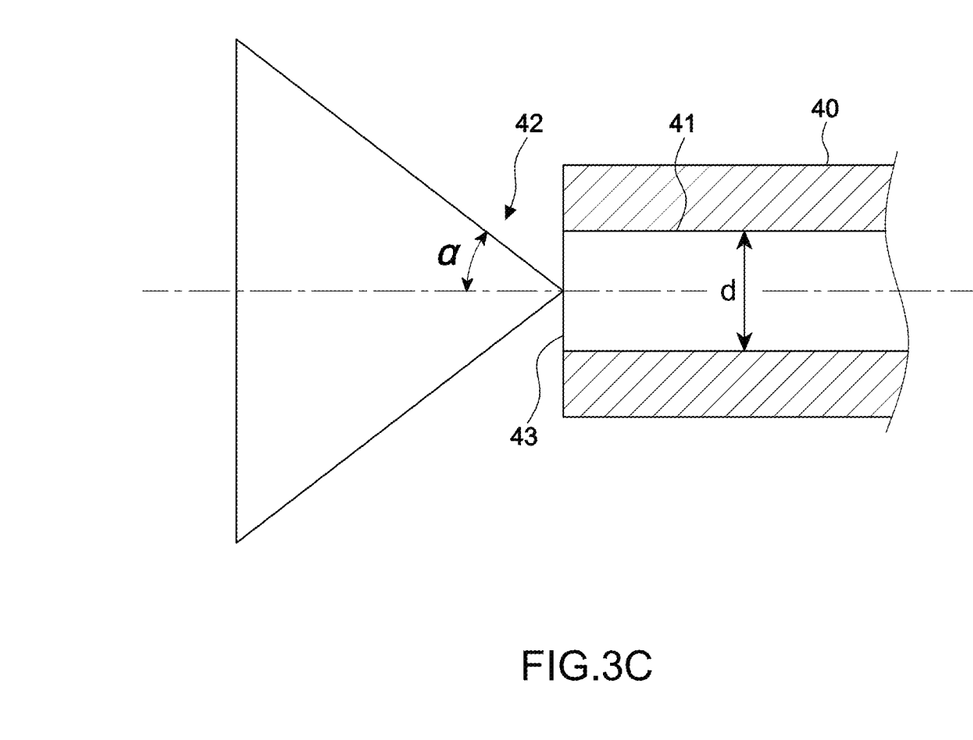
FIG. 3C is a schematic diagram illustrating the optic fiber of the present invention.
Figure 3D:
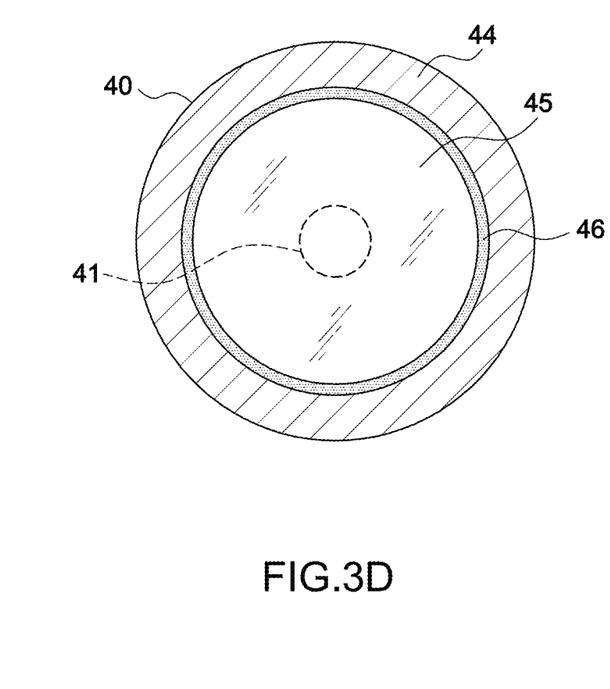
FIG. 3D is a schematic diagram illustrating the transparent mirror adopts with the airtight solder of the present invention.

Also, in this embodiment, as FIG. 3C showing, the diameter d of the core optical fiber 41 is 105 um, and the low numerical aperture 42 is 0.12, the numerical aperture is defined as NA=sin α, the α is the output light cone angle, and the optical fiber 40 adopts high hydroxyl value, and the end face 43 of the optical fiber 40 adopts laser beam cutting method; the high hydroxyl value is at least 150 mg KOH/g, and the best high hydroxyl value is 200~350 mg KOH/g, but the present invention is not limit to this application. In addition, in another embodiment, as shown in FIG. 3D, the output end 44 of the optical fiber 40 adopts a transparent mirror 45, and the transparent mirror 45 adopts an airtight solder 46, so the outer periphery of the transparent mirror 45 is combined with the airtight solder 46 to keep airtight at the output end 44 of the optical fiber 40, but the present invention is not limit to this application.

An optical software 50, which verifies the laser diode 20, for facilitating the design and optimization of the parameters of the optical lens module 30, and achieves a theoretical coupling efficiency of more than 90%, but the present invention is not limit to this application.

Figure 4:
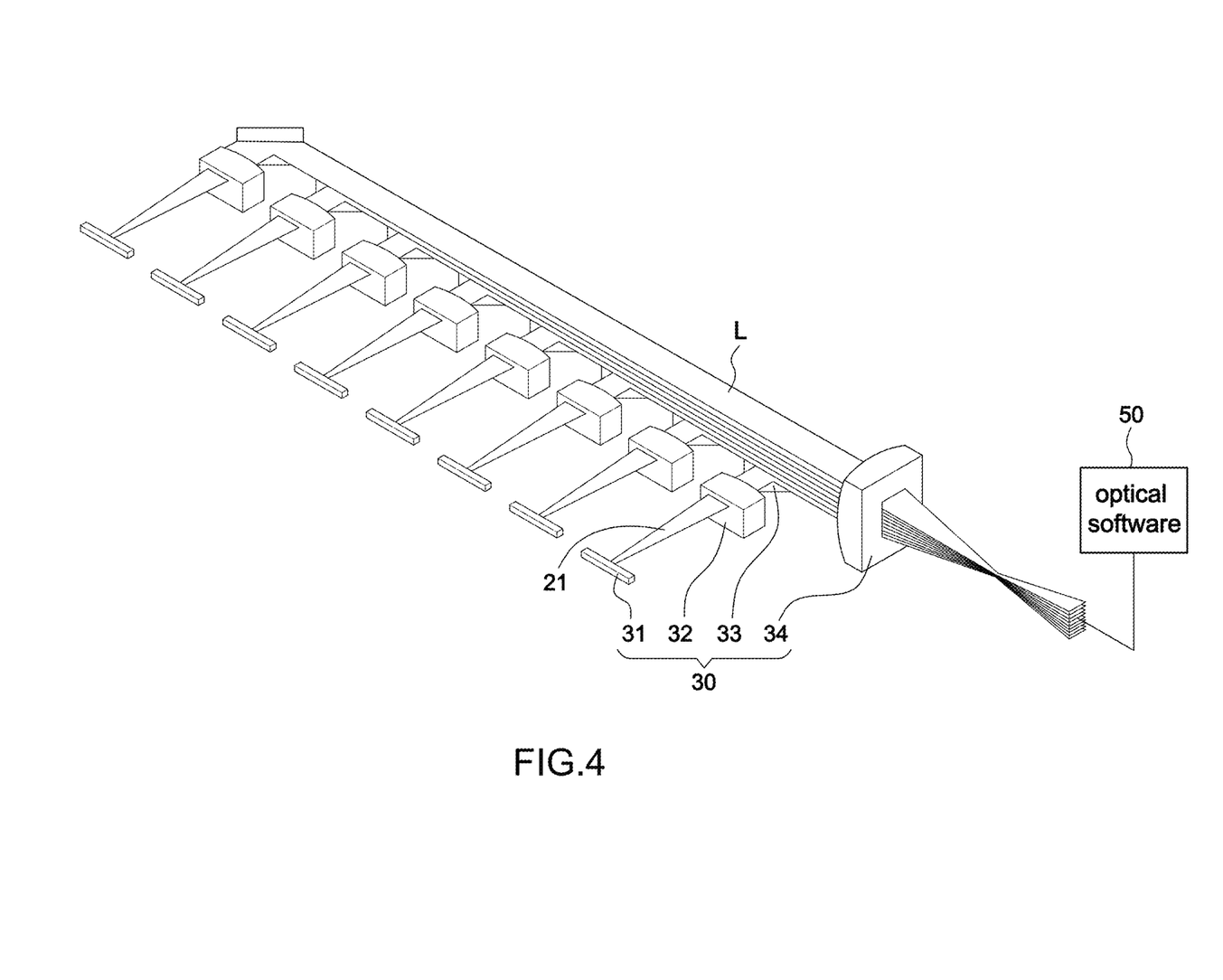
FIG. 4 is a schematic diagram illustrating the converging of the light beam by eight blue light laser space of the present invention.
Figure 5A:
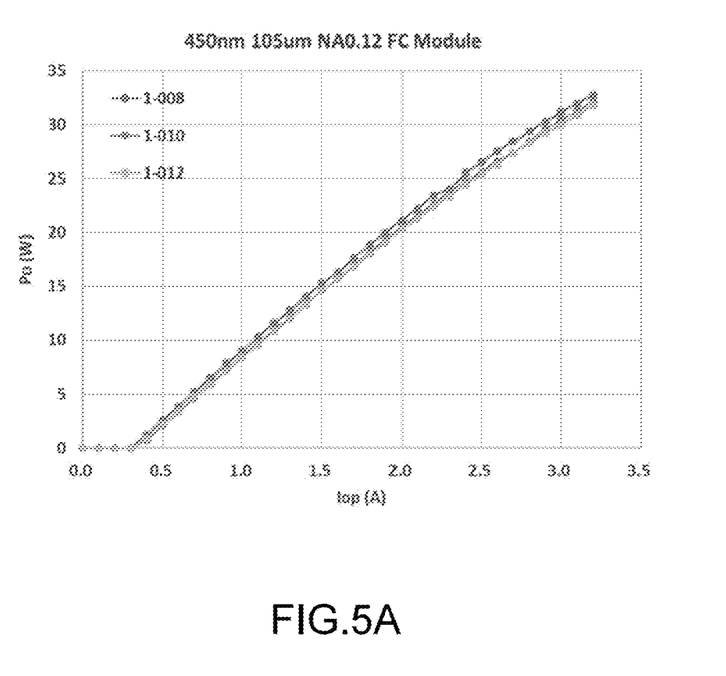
FIG. 5A is a graph illustrating the of the output optical power versus current of the optical fiber outputting blue laser of the present invention.
Figure 5B:
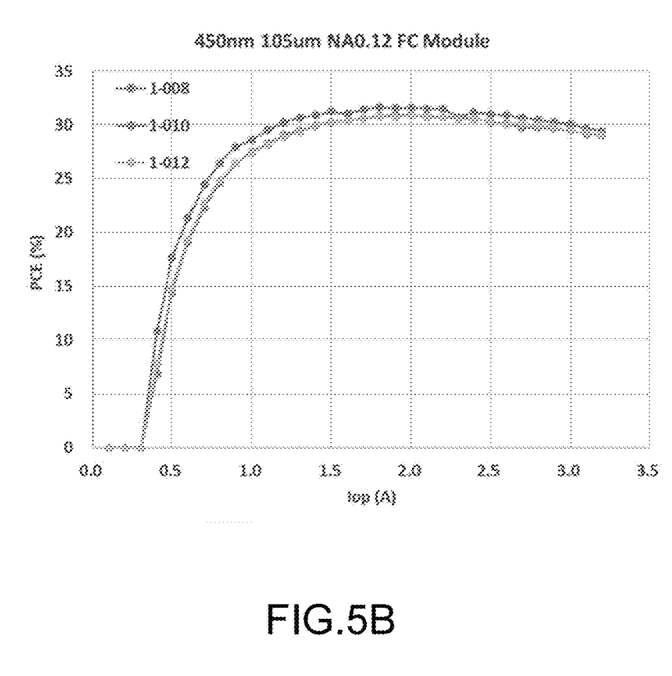
FIG. 5B is a graph illustrating the optical power conversion efficiency of the optical fiber outputting blue laser of the present invention.

With the feature disclosed above, the present invention adopts the output fiber with numerical aperture≤NA 0.12 and high hydroxyl value, making the optic fiber 40 has a better penetration rate for lasers with a wavelength of <460 nm; the end face 43 of the optic fiber 40 adopts laser beam cutting method, different from ordinary grinding and polishing, this method has the advantages of fast cutting and suitable for mass production, and reducing mirror damage caused by grinding; The laser chip 22 is packaged in an airtight environment to enhance the long-term durability of the laser, and the resonant cavity 221 of the laser chip 22 is coated with a reflective film 223 with a reflectivity ≥20% for withstanding the higher external reflected light, especially for laser processing purposes, as FIG. 4 showing, which is a schematic diagram illustrating the converging of the light beam by eight blue light laser space; As FIG. 5A showing, it is showing the output optical power versus current of the optical fiber outputting blue laser, and a fiber coupled (FC) module is formed on the condition that the wavelength is 450 nm, the diameter (d) of the core optical fiber 41 is 105 um, and the numerical aperture is ≤NA0.12; As FIG. 5B showing, which is an optical power conversion efficiency (PCE) of the optical fiber outputting blue laser, and a fiber coupled (FC) module is formed on the condition that the wavelength is 450 nm, the diameter (d) of the core optical fiber 41 is 105 um, and the numerical aperture is ≤NA0.12, but the present invention is not limit to this application.

Although particular embodiments of the invention have been described in detail for purposes of illustration, various modifications and enhancements may be made without departing from the spirit and scope of the invention. Accordingly, the invention is not limited except as by the appended claims.

What is claimed is:

1. A low numerical aperture fiber output diode laser module, comprising:
   a case;
   multiple laser diodes arranged inside the case for emitting light beams directed across the case, wherein each laser diode of said multiple laser diodes includes a laser chip configured with a resonant cavity having an end face, wherein the end face of the resonant cavity forms a specular surface electroplated with a reflective film, and wherein reflectance of the reflective film is ≥20%;
   an optical lens module arranged inside the case for collimating the light beams, and converging said light beams into a convergent light beam travelling substantially in perpendicular to the light beams along a space of the low numerical aperture fiber output diode laser module; and
   an optic fiber fabricated from a material having high hydroxyl value ranging between 200 and 350 mg KOH/g, the optic fiber having a core optical fiber, wherein the output of the optic fiber is configured with a low numerical aperture, and wherein the optic fiber is positioned at the lateral side of the case substantially in perpendicular to said light beams, so the convergent light beam is coupled with the core optical fiber to the low numerical aperture.

2. The low numerical aperture fiber output diode laser module as claimed in claim 1, wherein a diameter of the core optical fiber is 105 um, and the low numerical aperture is 0.12.

3. The low numerical aperture fiber output diode laser module as claimed in claim 1, wherein an end face of the optic fiber is fabricated by a laser beam cutting method.

4. The low numerical aperture fiber output diode laser module as claimed in claim 1, wherein an output end of the optic fiber includes a transparent mirror, wherein the transparent mirror has an airtight solder.

5. The low numerical aperture fiber output diode laser module as claimed in claim 1, including at least eight laser diodes.

6. The low numerical aperture fiber output diode laser module as claimed in claim 1, wherein the laser diode emits at a wavelength of 450 nm.

7. The low numerical aperture fiber output diode laser module as claimed in claim 1, wherein the optical lens module includes multiple fast axis collimating lenses, multiple slow axis collimating lenses and multiple reflecting mirrors, wherein the light beams emitted by the laser diodes are collimated by each of the fast axis collimating lenses and each of the slow axis collimating lenses, and wherein the light beams collimated by the fast and slow axis collimating lenses travel through each of the reflecting mirrors for converging into a convergent light beam in a space of the low numerical aperture fiber output diode laser module, and wherein the convergent light beam is coupled with the core optical fiber via a focusing lens.

8. The low numerical aperture fiber output diode laser module as claimed in claim 7, wherein the case includes a base and a cover, the base is provided with a concave part, the concave part has a mesa, wherein the mesa receives each of the laser diodes, so that the laser diodes can be arranged in parallel to each other, wherein each of the fast-axis collimating lenses is arranged on the mesa, in proximity to the front of each of the laser diodes, wherein each of the slow-axis collimating lenses and each of the reflecting lenses are arranged in the concave part of the base, and each of the slow-axis collimating lenses is arranged in front of a respective one of the fast-axis collimating lenses, wherein each of the reflecting lenses is arranged in front of a respective one of the slow-axis collimating lenses, and wherein the focusing lens is arranged on the lateral side of reflecting lenses and at the lateral side of the concave part, and in correspondence to the position of the core optical fiber.

9. A low numerical aperture fiber output diode laser module, comprising:
   a case, the case including a base and a cover, wherein the base is provided with a concave part, the concave part having a mesa;
   multiple laser diodes arranged substantially in parallel inside the mesa for emitting light beams extending across the case, wherein each laser diode of said multiple laser diodes includes a laser chip configured with a resonant cavity having an end face, wherein the end face of the resonant cavity forms a specular surface electroplated with a reflective film, and wherein reflectance of the reflective file is ≥20%;
   an optic fiber, the optic fiber having a core optical fiber, wherein the output of the optic fiber is configured with a low numerical aperture, and wherein the optic fiber extends from a lateral side of the case substantially in perpendicular to the light beams; and
   an optical lens module arranged inside the concave part of the case, wherein the optical lens module includes multiple fast axis collimating lenses, multiple slow axis collimating lenses and multiple reflecting mirrors, wherein the light beams emitted by the laser diodes are collimated by each of the fast axis collimating lenses and each of the slow axis collimating lenses, and wherein the light beams collimated by the fast and slow axis collimating lenses travel through each of the reflecting mirrors for converging into a convergent light beam traveling in perpendicular to the light beams in a space of the low numerical aperture fiber output diode laser module, and wherein the convergent light beam is coupled with the core optical fiber and directed via a focusing lens to the low numerical aperture, and wherein each of the fast-axis collimating lenses is arranged on the mesa in proximity to a front of each of the laser diodes, wherein each of the slow-axis collimating lenses and each of the reflecting lenses are arranged in the concave part of the base, and each of the slow-axis collimating lenses is arranged in alignment with a respective one of the fast-axis collimating lenses, wherein each of the reflecting lenses is arranged in from of a respective one of the slow-axis collimating lenses, wherein the focusing lens is arranged at a lateral side of the reflecting lenses and is positioned at the lateral side of the concave part of the base, wherein the position of the focusing lens corresponds to the position of the core optical fiber.

* * * * *